United States Patent
Han et al.

(10) Patent No.: US 9,935,163 B2
(45) Date of Patent: Apr. 3, 2018

(54) DISPLAY DEVICE AND METHOD FOR MANUFACTURING THE SAME

(71) Applicant: LG Display Co., Ltd., Seoul (KR)

(72) Inventors: Joonsoo Han, Sigheung-si (KR); Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 14/500,654

(22) Filed: Sep. 29, 2014

(65) Prior Publication Data
US 2015/0097172 A1   Apr. 9, 2015

(30) Foreign Application Priority Data
Oct. 8, 2013   (KR) .................. 10-2013-0120127

(51) Int. Cl.
*H01L 27/32* (2006.01)
*G02F 1/1362* (2006.01)

(52) U.S. Cl.
CPC .... *H01L 27/3265* (2013.01); *G02F 1/136213* (2013.01); *H01L 27/3262* (2013.01)

(58) Field of Classification Search
CPC ... H01L 29/78621; H01L 21/84; G02F 1/136; G02F 1/136213
See application file for complete search history.

(56) References Cited

U.S. PATENT DOCUMENTS

| 2003/0025127 A1* | 2/2003 | Yanai | H01L 27/12 257/158 |
| 2004/0087067 A1* | 5/2004 | Yoneda | G02F 1/136227 438/148 |
| 2005/0202601 A1* | 9/2005 | Koide | H01L 29/78621 438/149 |

(Continued)

FOREIGN PATENT DOCUMENTS

| CN | 1512830 A | 7/2004 |
| CN | 102237411 A | 11/2011 |
| CN | 102468324 A | 5/2012 |

OTHER PUBLICATIONS

Office Action for Chinese Patent Application No. CN 201410515200.0, dated Dec. 1, 2016, 15 Pages.

(Continued)

*Primary Examiner* — Thao X Le
*Assistant Examiner* — Geoffrey Ida
(74) *Attorney, Agent, or Firm* — Fenwick & West LLP (57) ABSTRACT

Provided are a display device and a method of manufacturing the same. A display device includes a coplanar thin-film transistor and a capacitor. The coplanar thin-film transistor comprises a gate electrode, an active layer including an oxide semiconductor, a source electrode and a drain electrode. The capacitor comprises a lower electrode, intermediate electrode and upper electrode. And the lower electrode is comprised of the same material as the active layer, and is conductivized. Also, the upper electrode is connected to the (Continued)

lower electrode. By using the conductivized lower electrode, the capacitor is configured to operate as multiple capacitors. Thus, the size of the capacitor is reduced, and sufficient capacitance may be secured with the capacitor with a smaller area. In this way, the area of each sub-pixel in the display device may be reduced, thereby achieving high resolution.

25 Claims, 6 Drawing Sheets

(56) References Cited

U.S. PATENT DOCUMENTS

| 2009/0001360 A1* | 1/2009 | Nakayama | H01L 27/1225 257/40 |
| 2015/0049128 A1* | 2/2015 | Iwata | G02F 1/134309 345/690 |

OTHER PUBLICATIONS $2^{nd}$ Notification of Office Action for Chinese Patent Application No. CN 201410515200.0, dated Jul. 19, 2017, 18 Pages (With English Translation).

\* cited by examiner

DISPLAY DEVICE AND METHOD FOR MANUFACTURING THE SAME

CROSS-REFERENCE TO RELATED APPLICATIONS

This application claims the priority of Korean Patent Application No. 10-2013-0120127 filed on Oct. 8, 2013, in the Korean Intellectual Property Office, the disclosure of which is incorporated herein by reference.

BACKGROUND OF THE INVENTION

Field of the Invention

The present disclosure is directed to a display device and a method of manufacturing the same, and specifically to a display device that can control stable capacitance of a storage capacitor as the storage capacitor with a smaller size, and a method of manufacturing the same.

Description of the Related Art

A display device driven in an active-matrix type includes a thin-film transistor in each of sub-pixels, and a liquid crystal layer or an organic light-emitting element depending on the type of the display device. Further, each of the sub-pixels includes a storage capacitor to control data voltage stably. In a display device including a liquid crystal layer, the storage capacitor can maintain data voltage stably, that is, a voltage difference between a pixel electrode and a common electrode. In a display device including an organic light-emitting element, the storage capacitor can maintain data voltage stably, that is, a voltage difference between the gate electrode and the source electrode, or the gate electrode and the drain electrode, of a driving transistor.

SUMMARY OF THE INVENTION

As the area of each sub-pixel is reduced in order to achieve higher resolution of a display device, the size of a thin-film transistor (TFT) or a storage capacitor in each of sub-pixels is reduced. This results in decrease in capacitance of the storage capacitor. When this happens, the data voltage in a sub-pixel becomes unstable. Therefore, sufficient capacitance of the storage capacitor should be secured.

The storage capacitor needs a certain minimal size in order to secure the capacitance. The inventors of the present disclosure have developed a display device with minimized size of the storage capacitor while maintaining capacitance to supply stable data voltage via using an oxide semiconductor as an electrode of the storage capacitor. Also, a method of manufacturing the display device is disclosed.

An object of the present disclosure is to provide a storage capacitor having the same capacitance with a conventional storage capacitor, though the size of the storage capacitor is smaller than that of the conventional storage capacitor. This results in reduction of the area of a sub-pixel, hence, an increase of the number of sub-pixels per unit area, and thus provision of a display device having higher resolution.

Further, another object of the present disclosure is to provide a transparent organic light-emitting display device with a storage capacitor having a smaller size than that of the conventional storage capacitor. Thus the transmittance of the transparent organic light-emitting display device is improved, since the size of light-emitting region with the storage capacitor decreases and the size of light-transmissive region without the storage capacitor increases. Further, a method of manufacturing the same is disclosed.

Objects of the present disclosure are not limited to those described above. Other objects not described herein will be clearly understood by a person skilled in the art from the following description.

According to an aspect of the present disclosure, there is provided a display device capable of achieving above-mentioned objects. The display device includes a substrate, a coplanar thin-film transistor, and a storage capacitor. The coplanar thin-film transistor includes an active layer including an oxide semiconductor, a gate electrode, and a source or drain electrode. The storage capacitor comprises a lower electrode, a first insulation layer, an intermediate electrode, a second insulation layer, and an upper electrode. And the lower electrode is comprised of the same material as the active layer, and is conductivized.

By using the conductivized lower electrode, the storage capacitor is configured to operate as multiple capacitors. Thus, the size of the storage capacitor is reduced. In addition, sufficient capacitance may be secured with the storage capacitor with a smaller size. In this way, the area of each sub-pixel in the display device may be reduced, thereby achieving high resolution.

When the display device is a transparent organic light-emitting display device, the smaller size of the storage capacitor allows for reduction of an size of a light-emitting region and relatively for increase of an size of a light-transmissive region. Thus, the transmittance of the transparent organic light-emitting display device is improved.

According to an exemplary embodiment of the present disclosure, a layer comprised of the same material as an active layer is patterned using a half-tone mask, and is conductivized. Thus, the number of processes for manufacturing the display device can be minimized.

Other particulars of exemplary embodiments are illustrated in the detailed description and the accompanying drawings.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements. Indicating that elements or layers are "directly on" other elements or layers means a case in which the corresponding elements are just above other elements.

The same reference numerals indicate the same elements throughout the specification.

In the drawings, size and thickness of each element are arbitrarily illustrated for convenience of description, and the present invention is not necessarily limited to those illustrated in the drawings.

Although first, second, and the like are used in order to describe various components, the components are not limited by the terms. The above terms are used only to discriminate one component from the other component. Therefore, a first component mentioned below may be a second component within the technical spirit of the present invention.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship.

Figure 1A:
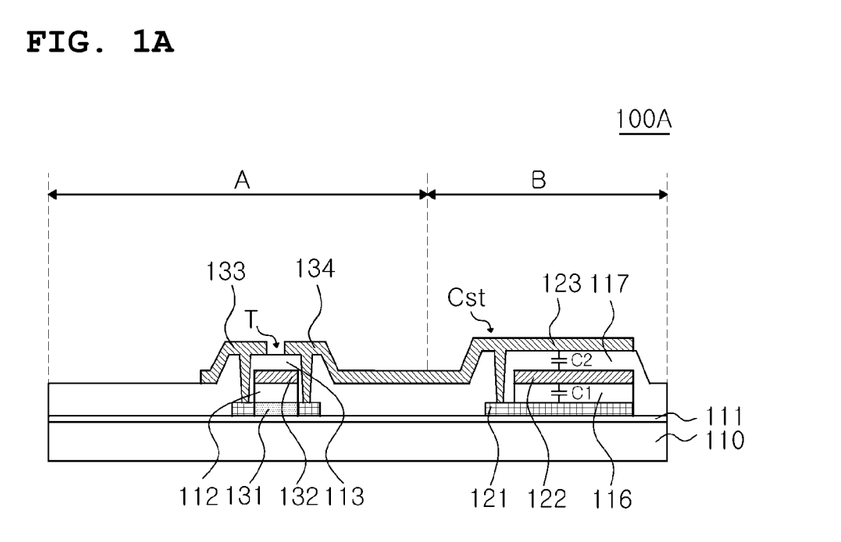
FIG. 1A is a cross-sectional view of a display device according to an exemplary embodiment of the present disclosure.

FIG. 1A is a cross-sectional view of a display device according to an exemplary embodiment of the present disclosure. A display device 100A includes a coplanar thin-film transistor T and a storage capacitor Cst.

A substrate 110 includes a region A in which the coplanar thin-film transistor T is formed and a region B in which the storage capacitor Cst is formed. In the region A of the substrate 110, an active layer 131, a gate insulation layer 112, a gate electrode 132, an inter-insulation layer 113, a source electrode 133, and a drain electrode 134 are stacked on one another, to form the coplanar thin-film transistor T. In the region B of the substrate 110, a lower electrode 121, a first insulation layer 116, an intermediate electrode 122, a second insulation layer 117, and an upper electrode 123 are stacked on one another, to form the storage capacitor Cst. The lower electrode 121, the first insulation layer 116, the intermediate electrode 122, and the second insulation layer 117, and the upper electrode 123 in the region B may be formed of the same materials and in the same processes as the active layer 131, the gate insulation layer 112, the gate electrode 132, the inter-insulation layer 113, the source and the drain electrodes 133 and 134 in the region A, respectively.

A buffer layer 111 is formed on the substrate 110. The buffer layer 111 may reduce permeation of moisture or impurities through the substrate 110, and may make a surface of the substrate flat. The buffer layer 111 may be formed of a silicon oxide film, a silicon nitride film or a dual layer thereof. On the buffer layer 111, the coplanar thin-film transistor T and the storage capacitor Cst is formed.

In the following description, the configuration of the coplanar thin-film transistor T formed in the region A of the substrate 110 will be described first and then that of the storage capacitor Cst formed in the region B will be described.

The active layer 131 including an oxide semiconductor is formed in the region A of the substrate 110. The oxide semiconductor included in the active layer 131, for example, may be comprised of indium-gallium-zinc-oxide (InGaZnO) based material. The active layer 131 includes a source region, a drain region, and a channel region. The source region and the drain region of the active layer 131 may be conductivized for better contact efficiency with the source electrode 133 and the drain electrode 134, respectively.

Referring to FIG. 1A, the channel region of the active layer 131 overlapping and below the gate electrode 132 is an oxide semiconductor, while the source region in contact which the source electrode 133 and the drain region in contact with the drain electrode 134 are regions where an oxide semiconductor is conductivized. As used herein, it is assumed that the active layer 131 includes all of the conductivized source region, the conductivized drain region, and the channel region. As used herein, the expression "X is conductivized" does not mean that the X becomes a complete conductor, but means that it has a property similar to a conductor. For example, the "oxide semiconductor is conductivized" means that the surface resistivity of the oxide semiconductor became $10^3$ $\Omega/\square$ (ohm per square) or smaller.

The gate insulation layer 112 is formed on the active layer 131. The gate insulation layer 112 insulates the gate electrode 132 from the active layer 131. The gate insulation layer 112 may be formed of, but is not limited to, a silicon oxide film, a silicon nitride film or a dual layer thereof. In some embodiments, the gate insulation layer 112 may be formed only on the active layer 131 overlapping and below the gate electrode 132. In some other embodiments, the gate insulation layer 112 may be formed over the entire surface of the substrate 110.

The gate electrode 132 is formed on the gate insulation layer 112. At least a part of the gate electrode 132 is overlapped and above the active layer 131. The gate electrode 132 may be formed of a conductive material.

The inter-insulation layer 113 may be formed on the gate electrode 132. The inter-insulation layer 113 may be formed of the same material as the gate insulation layer 112. The inter-insulation layer 113 is formed over the entire surface of the substrate 110, and the source electrode 133 and the drain electrode 134 is electrically connected to the active layer 131 via contact holes formed in the inter-insulation layers 113.

The source electrode 133 and the drain electrode 134 are formed on the inter-insulation layer 113. The source electrode 133 and the drain electrode 134 is contact with the active layer 131 via the contact holes formed in the inter-insulation layer 113, respectively. To be specific, the source electrode 133 is in contact with the source region of the active layer 131, and the drain electrode 134 is in contact with the drain region of the active layer 131. The source and the drain electrode 133 and 134 may be formed of conductive materials.

Now, the configuration of the storage capacitor Cst formed in the region B of the substrate 110 will be described.

The lower electrode 121 of the storage capacitor Cst is formed at the same plane as the active layer 131 of the coplanar thin-film transistor T on the substrate 110. The lower electrode 121 may be formed of the same oxide semiconductor material as the active layer 131. Also, the lower electrode 121 may be formed by patterning the same oxide semiconductor material as the active layer 131 to a desired size, and then conductivizing it.

The first insulation layer 116 is formed on the lower electrode 121. The first insulation layer 116 insulates the intermediate electrode 122 from the lower electrode 121 and serves as a dielectric in a first capacitor C1 between the lower electrode 121 and the intermediate electrode 122. In addition, the first insulation layer 116 may be formed of substantially the same material or may be the same layer as the above-described gate insulation layer 112. When the first insulation layer 116 is the same layer as the gate insulation layer 112, the number of processes may be reduced compared to when the gate insulation layer 112 and the first insulation layer 116 are separately formed.

The first insulation layer 116 is to insulate the intermediate electrode 122 from the lower electrode 121. Thus, as illustrated in the FIG. 1A, the first insulation layer 116 is formed only on the lower electrode 121. But, the present disclosure is not limited thereto. The first insulation layer 116 may be formed over the entire surface of the substrate 110.

The intermediate electrode 122 is positioned on the first insulation layer 116. At least apart of the intermediate electrode 122 is overlapped the lower electrode 121. The intermediate electrode 122 may be formed of a conductive material and may be formed of the same material as the above-described gate electrode 132. The intermediate electrode 122 may be electrically connected to the gate electrode 132.

In the display device 100A according to the exemplary embodiment of the present disclosure, the intermediate electrode 122, the first insulation layer 116 and the lower electrode 121 form the first capacitor C1 having first capacitance.

Capacitance is in inverse proportion to the thickness of a dielectric between two electrodes of a capacitor. Accordingly, the first capacitance of the first capacitor C1 is in inverse proportion to the thickness of the first insulation layer 116. Thus, the first insulation layer 116 may be formed as thin as possible in order to increase the first capacitance. The first insulation layer 116 may be formed of the same material as the gate insulation layer 112 but may have different thickness from the gate insulation layer 112. For example, the first insulation layer 116 may be thinner than the gate insulation layer 112. That is, the distance from the lower electrode 121 to the intermediate electrode 122 may be shorter than the distance between the active layer 131 to the gate electrode 132. Reducing the thickness of the first insulation layer 116 can increase the capacitance of the first capacitor C1.

The second insulation layer 117 may be formed on the intermediate layer 122. The second insulation layer 117 insulates the upper electrode 123 from the intermediate electrode 122 and serves as a dielectric in a second capacitor C2 between the intermediate electrode 122 and the upper electrode 123. The second insulation layer 117 may be formed of the same material and formed in the same layer as the above-described inter-insulation layer 113. The number of processes may be reduced by forming the second insulation layer 117 and the inter-insulation layer 113 together in a single step.

The upper electrode 123 is positioned on the second insulation layer 117. At least a part of the upper electrode 123 is overlapped the intermediate electrode 122. The upper electrode 123 may be formed of a conductive material and may be formed of the same material as the above-described source electrode 133 or the drain electrode 134. In FIG. 1A, the upper electrode 123 is connected to the lower electrode 123.

Also, in FIG. 1A, the upper electrode 123 is connected with the drain electrode 134 of the coplanar thin-film transistor T. However, in some other embodiments, the upper electrode 123 may be connected to the source electrode 133 depending on the type and the operation conditions of the coplanar thin-film transistor T.

In the display device 100A according to the exemplary embodiment of the present disclosure, the intermediate electrode 122, the second insulation layer 117 and the upper electrode 123 form a second capacitor C2 having second capacitance.

The second insulation layer 117 may be reduced in order to increase the second capacitance. The second insulation layer 117 may be formed of the same material as the inter-insulation layer 113 but may have a thickness different from the inter-insulation layer 113. For example, the second insulation layer 117 may be thinner than the inter-insulation layer 113. That is, the distance from the intermediate electrode 122 to the upper electrode 123 may be shorter than the distance between the gate electrode 132 to the source electrode 133 or the distance between the gate electrode 132 to the drain electrode 134. When the second insulation layer 117 is thinner than the inter-insulation layer 113, the second capacitor C2 may have capacitance larger than that when the second insulation layer 117 and the inter-insulation layer 113 have the same thickness.

The first capacitor C1 comprises the lower electrode 121, the first insulation layer 116 and the intermediate electrode 122. The second capacitor C2 comprises the upper electrode 123, the second insulation layer 117, and the intermediate electrode 122. The lower electrode 121 and the upper electrode 123 are connected to each other such that the first capacitor C1 and the second capacitor C2 are connected to each other in parallel to operate as a one storage capacitor Cst.

When the first insulation layer 116 may be formed simultaneously with the gate insulation layer 112, the thickness of the first insulation layer 116, which sets the first capacitance of the first capacitor C1, may be the same as that of the gate insulation layer 112. Similarly, the second capacitance of the second capacitor C2 may be affected by the thickness of the inter-insulation layer 113 when the second insulation layer 117 is formed simultaneously with the inter-insulation layer 116.

When forming the coplanar thin-film transistor T, the gate insulation layer 112 may be thinner than the inter-insulation layer 113. In such cases, the first insulation layer 116 may be thinner than the second insulation layer 117, and the first capacitance may be larger than the second capacitance.

By configuring the storage capacitor Cst as illustrated in FIG. 1A, the size of the storage capacitor Cst can be reduced while providing at least the same or greater capacitance than the conventional storage capacitor configuration. With the reduced size of the storage capacitor Cst, the area of each of sub-pixels can be reduced. This can increase the number of sub-pixels per unit area, thereby achieving a higher resolution in a display device.

Referring to FIG. 1A, a coplanar thin-film transistor T has a structure in which a source electrode 133, a drain electrode 134, and a gate electrode 132 are formed above an active layer 131. On the contrary, a staggered thin-film transistor has a structure in which a gate electrode, an insulation layer, an active layer, and a source electrode and a drain electrode are formed in order. In this setting, the source and drain electrodes are electrically connected to the active layer without an additional insulation layer therebetween, which makes it difficult to form a capacitor by conductivizing a portion of the semiconductor layer.

In order to utilize a portion of the semiconductor layer as an independent electrode for the capacitor in the staggered thin-film transistor, it is necessary to form the additional insulation layer on the active layer and to conduct an additional opening process. Therefore, when conductivizing a portion of the semiconductor layer to utilize it as the electrode of the capacitor, the coplanar thin-film transistor T is advantageous over the staggered thin-film transistor.

Figure 1B:
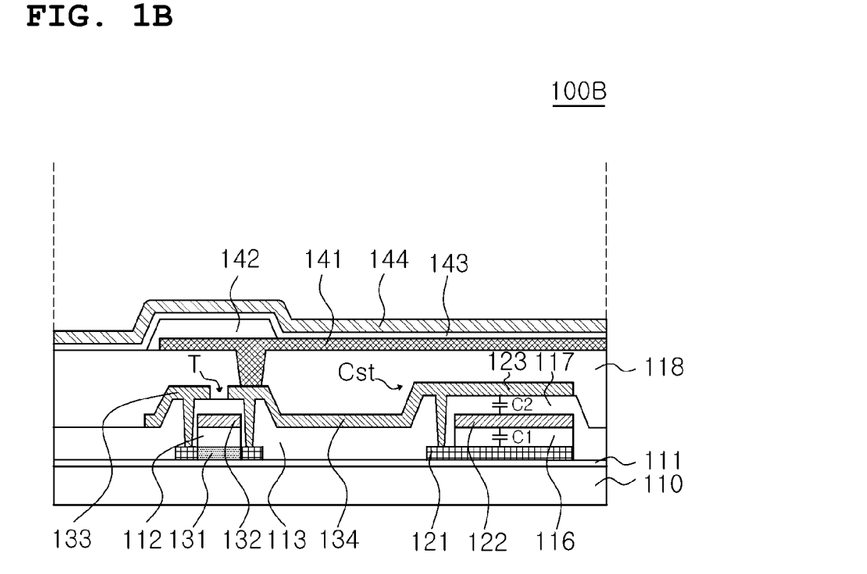
FIG. 1B is a cross-sectional view of an organic light-emitting display device according to an exemplary embodiment of the present disclosure.

FIG. 1B is a cross-sectional view of an organic light-emitting display device according to an exemplary embodiment of the present disclosure. Among the elements of the organic light-emitting display device 100B illustrated in FIG. 1B, redundant descriptions on the elements substantially the same as those in FIG. 1A will not be made.

Referring to FIG. 1B, an organic light-emitting element including an anode 141, an organic light-emitting layer 143 and a cathode 144 is formed on a planarization layer 118. The organic light-emitting layer 143 may be formed on the anode 141, and the cathode 144 may be formed on the organic light-emitting layer 143. The anode 141 is electrically connected to a drain electrode 134 of a coplanar thin-film transistor T via a contact hole in the planarization layer 118, and a bank layer 142 covers the contact hole. That is, the anode 141 is electrically connected to the upper electrode 123 and the drain electrode 134. Although not depicted in FIG. 1B, the stepped portion in the anode 141 due to the contact hole may cause light leakage from the sub-pixel. In order to reduce this, the bank layer 142 may be formed to cover the contact hole. In this manner, the visibility of the organic light-emitting display device 100B can be improved.

In the organic light-emitting display device 100B according to the exemplary embodiment of the present disclosure, a portion of an oxide semiconductor layer formed on the same plane as an active layer 131 of the coplanar thin-film transistor T is conductivized to serve as a lower electrode 121 of a storage capacitor Cst. On the lower electrode 121, a first insulation layer 116, an intermediate electrode 122, a second insulation layer 117 and an upper electrode 123 are stacked in the stated order to form the storage capacitor Cst. Accordingly, the storage capacitor Cst with sufficient capacitance may be formed even in a limited area thereof.

When the storage capacitor Cst is configured as illustrated in FIG. 1B, the same capacitance can be obtained from the storage capacitor Cst even when it has a smaller size than a conventional storage capacitor. Using the smaller storage capacitor Cst, the area of each of sub-pixels can be reduced and thus the number of sub-pixels per unit area can be increased. This results in a display device with higher resolution.

In some embodiments, the display device may be a bottom emission type organic light-emitting display device. In such embodiments, the size of the light-emitting region excluding the size of the storage capacitor Cst can be enlarged by employing the storage capacitor Cst illustrated in FIG. 1B.

The organic light-emitting display device 100B according to the exemplary embodiment of the present disclosure may include a plurality of sub-pixels, and the sub-pixels may respectively include at least a coplanar thin-film transistor T and at least a storage capacitor Cst. Also, the storage capacitor Cst in at least one of the plurality of sub-pixels has a size that is different from the size of the storage capacitor in another sub-pixel. In the organic light-emitting display device 100B, sub-pixels may require different currents for driving, respectively. The sizes of the storage capacitors Cst included in the different sub-pixels may be designed based on the different driving currents. By designing the storage capacitors Cst having different sizes, the efficiency of the storage capacitor Cst in each of the sub-pixels can be maximized, and a space for an additional thin-film transistor can be obtained, if necessary.

Figure 2:
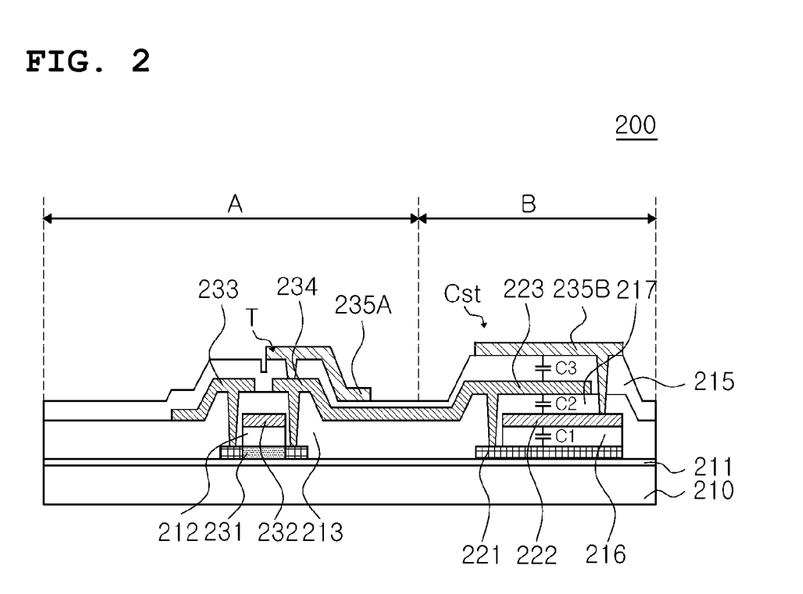
FIG. 2 is a cross-sectional view of an organic light-emitting display device according to an exemplary embodiment of the present disclosure.

FIG. 2 is a cross-sectional view of a display device 200 according to an exemplary embodiment of the present disclosure. Elements of the display device 200 illustrated in FIG. 2, corresponding to the elements in FIG. 1A will not be described again for simplicity.

Referring to FIG. 2, a third insulation layer 215 is formed on an upper electrode 223, a source and a drain electrodes 233 and 234. A connection part 235A and an additional electrode 235B are formed on the third insulation layer 215. The third insulation layer 215 may be formed of a material that may serve as a dielectric layer between the upper electrode 223 and the additional electrode 235B. The third insulation layer 215 may be formed of a silicon oxide film, a silicon nitride film or multiple layers thereof. The connection part 235A is arranged to overlap with the drain electrode 234, and at least a part of the additional electrode 235B is arranged to overlap with the upper electrode 223. The connection part 235A is electrically connected to the drain electrode 234. The connection part 235A and the additional electrode 235B may be formed of a conductive material. In some embodiments of the present disclosure, the connection part 235A may be omitted.

The additional electrode 235B and the upper electrode 223 form a third capacitor C3 with the third insulation layer 215 serving as a dielectric layer.

The third capacitor C3 is connected to the first capacitor C1 and the second capacitor C2 in parallel, to configure a storage capacitor Cst. In other words, the first capacitor C1 comprises the lower electrode 221, the first insulation layer 216 and the intermediate electrode 222. The second capacitor C2 comprises the upper electrode 223, the second insulation layer 217 and the intermediate electrode 222. Also, the third capacitor C3 comprises the upper electrode 223, the third insulation layer 215, and the additional electrode 235B. Here, the upper electrode 223 is connected to the lower electrode 221, and the additional electrode 235B is connected to intermediate electrode 222. In this way, the storage capacitor Cst may operate like three capacitors connected to one another in parallel.

By forming the third capacitor C3 connected in parallel, the storage capacitor Cst may provide larger capacitance without increasing the size of the storage capacitor Cst. Moreover, since sufficient capacitance can be obtained without enlarging the size of the storage capacitor, the area of a sub-pixel can be reduced to increase the number of sub-pixels per unit area. This leads to providing a display device with higher resolution.

Figure 3:
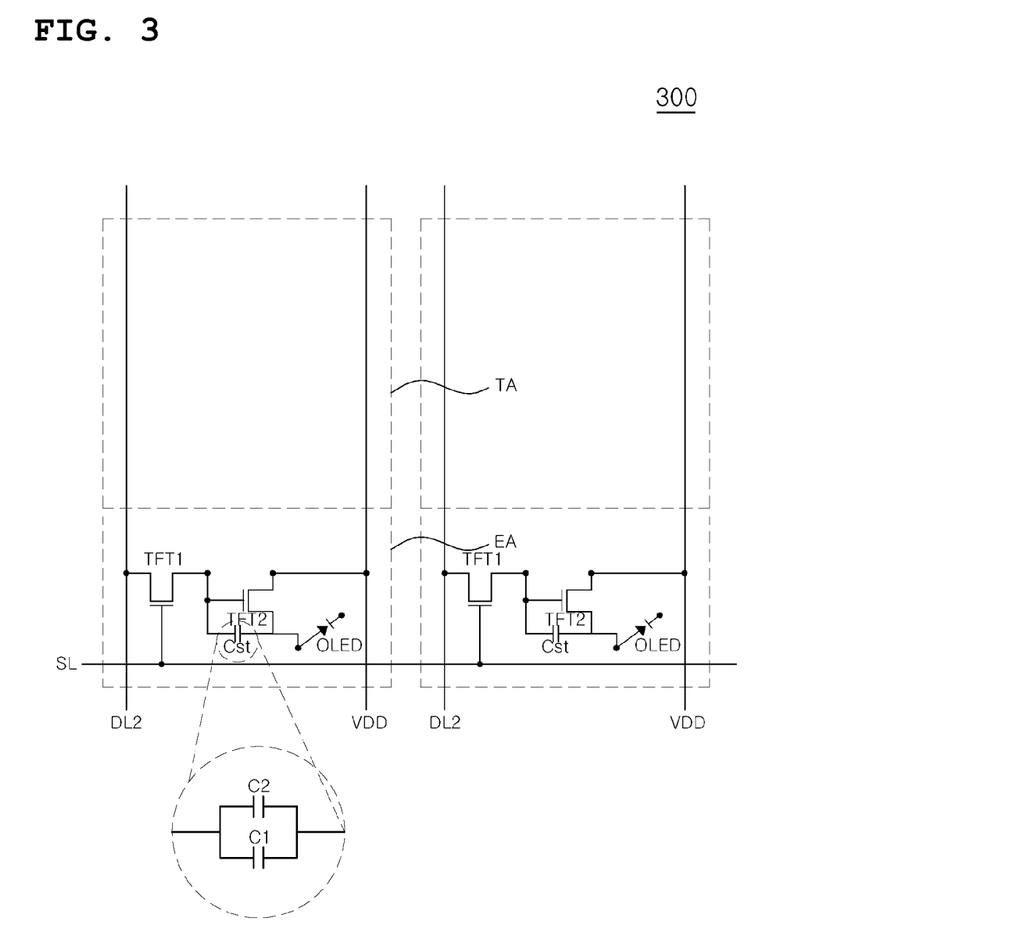
FIG. 3 is a simplified plan view of a display device according to an exemplary embodiment of the present disclosure.

FIG. 3 is a simplified diagram for illustrating a transparent organic light-emitting display device according to an exemplary embodiment of the present disclosure.

As used herein, the transparent organic light-emitting display device 300 refers to a display device provided with a certain transmittance, which enables a user to see through the transparent organic light-emitting display device 300.

For example, the transmittance of the transparent organic light-emitting display device 300 may be equal to or higher than 20%.

Referring to FIG. 3, each of the sub-pixels may include a light-transmissive region TA and a light-emitting region EA. The light-emitting region EA may include a switching transistor TFT1, a driving transistor TFT2 and a storage capacitor Cst. The light-transmissive region TA allows light from the outside to pass through it. Therefore, if the transistors TFT1 and TFT2 and the storage capacitor Cst are formed in the light-transmissive region TA, the transmittance of the transparent organic light-emitting display device 300 decreases and thus a user may not be able to clearly recognize an object through the display device. For this reason, the transistors TFT1 and TFT2 and the storage capacitor Cst may be positioned in the light-emitting region EA, as illustrated in FIG. 3.

In the organic light-emitting display device 300 according to the exemplary embodiment of the present disclosure, the storage capacitor Cst is formed in a following manner. The lower electrode of the storage capacitor is formed by conductivizing the oxide semiconductor layer that serves as the active layers of the transistors TFT1 and TFT2. The first insulation layer, the intermediate electrode, and the second insulation layer, and the upper electrode are stacked on the lower electrode in this order. The first capacitor C1 includes a lower electrode, a first insulation layer, and an intermediate electrode. And the second capacitor C2 includes an upper electrode, a second insulation layer, and an intermediate electrode. The first capacitor C1 and the second capacitor C2 may be connected to each other in parallel and may behave as one storage capacitor Cst. The storage capacitor Cst comprised of capacitors C1 and C2 may be formed with an size equal to or smaller than two-thirds of the size of a conventional storage capacitor having the same capacitance as the storage capacitor Cst. Also, the size of the storage capacitor Cst may be equal to or smaller than 20% of the size of one sub-pixel.

Since the storage capacitor Cst in the transparent organic light-emitting display device 300 may be implemented with a smaller size than the conventional storage capacitor having the equal capacitance thereto, the area of the light-emitting region EA can be reduced. Thus, the area of the light-transmissive region TA can increase relatively in a sub-pixel, and, hence, the transmittance of the transparent organic light-emitting display device 300 can increase. Further, even when the area of the light-transmissive region TA does not increase, the area of a sub-pixel can be reduced so that the number of sub-pixels per unit area can be increased. This results in increasing the resolution of the transparent organic light-emitting display device 300. Although the storage capacitor illustrated in FIG. 3 is configured by connecting two capacitors to each other in parallel, the configuration of the storage capacitor is not limited thereto but may be configured by connecting three or more capacitors to one another in parallel.

In order to improve the reliability of an organic light-emitting display device, various thin-film transistors may be added thereto. For instance, an initialization thin-film transistor, a discharge thin-film transistor, an internal compensation thin-film transistor, a threshold voltage (Vth) compensation thin-film transistor, a sampling thin-film transistor, an emission thin-film transistor and the like may be added thereto.

In various exemplary embodiments of the present disclosure, the light-emitting region EA of a transparent organic light-emitting display device 300 has limited space, and, thus, the above-described various thin-film transistors and the storage capacitor may not be included due to the limited space. In particular, since the capacitance of the storage capacitor Cst is proportional to the size of the storage capacitor Cst, sufficient space is necessary in order to secure capacitance to drive the transparent organic light-emitting display device 300. As for the storage capacitor Cst according to an exemplary embodiment of the present disclosure, an active layer is conductivized so as to be employed as an electrode for multiple storage capacitors Cst. Thus, sufficient capacitance can be secured even in small space and thus additional thin-film transistors can be included.

Figure 4:
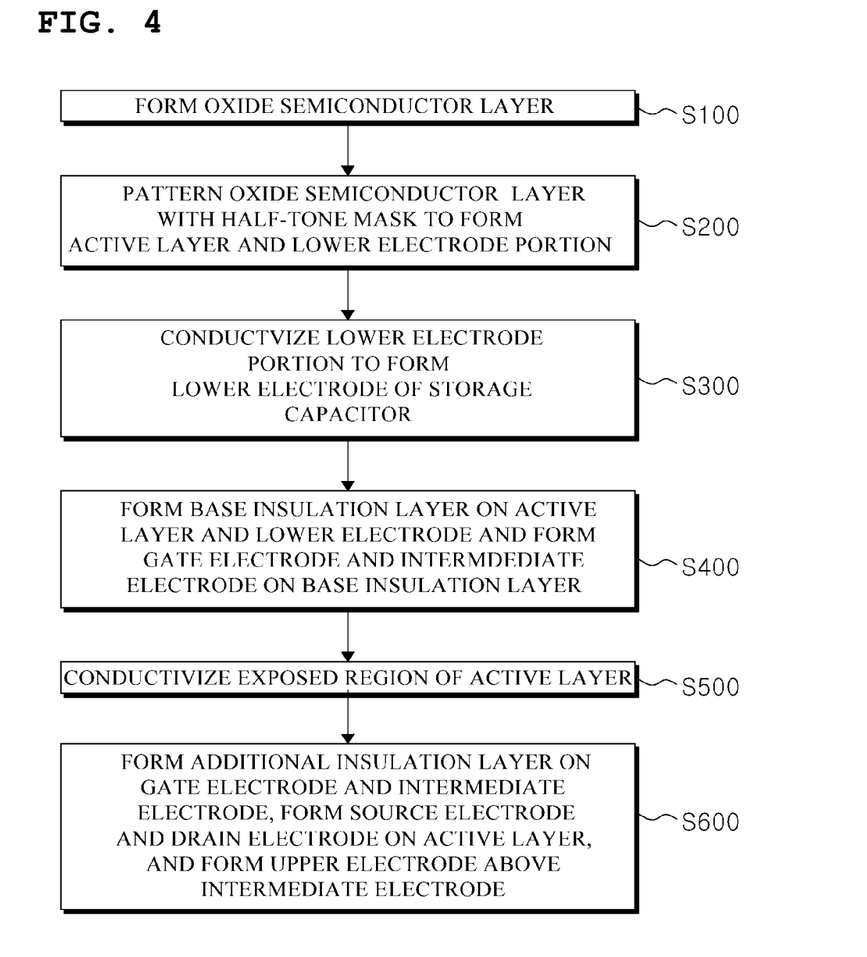
FIG. 4 is a flowchart for illustrating a method of manufacturing an organic light-emitting display device according to an exemplary embodiment of the present disclosure.

FIG. 4 is a flowchart for illustrating a method of manufacturing a display device according to an exemplary embodiment of the present disclosure. FIGS. 5A to 5F are cross-sectional views each illustrating a processing step for manufacturing a display device according to an exemplary embodiment of the present disclosure.

According to the method of manufacturing a display device according to the exemplary embodiment of the present disclosure, a coplanar thin-film transistor T and a storage capacitor Cst may be formed in a sub-pixel of the display device.

Initially, an oxide semiconductor layer 530 is formed on the substrate 510 (S100). Subsequently, the oxide semiconductor layer 530 is patterned using a half-tone mask 501 to form an active layer 530A and a lower electrode portion 530B (S200).

Figure 5A:
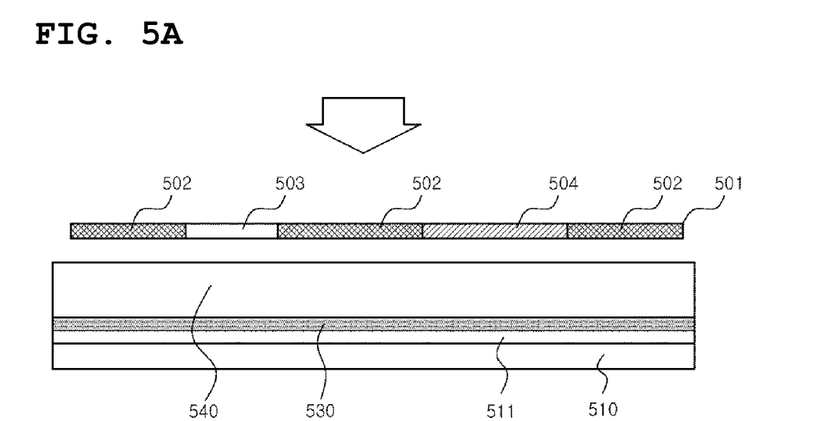
FIGS. 5A to 5F are cross-sectional views each illustrating a processing step for manufacturing an organic light-emitting display device according to an exemplary embodiment of the present disclosure.

Referring to FIG. 5A, the buffer layer 511, the oxide semiconductor layer 530, and a photoresist layer 540 are stacked on one another in this order on the substrate 510. The half-tone mask 501 may include a block portion 502 blocking light, a transmissive portion 503 allowing for light to pass therethrough, and a translucent portion 504 allowing for partial light to pass therethrough. After the half-tone mask 501 is disposed on the photoresist layer 540, exposure process is performed followed by a development process.

Figure 5B:
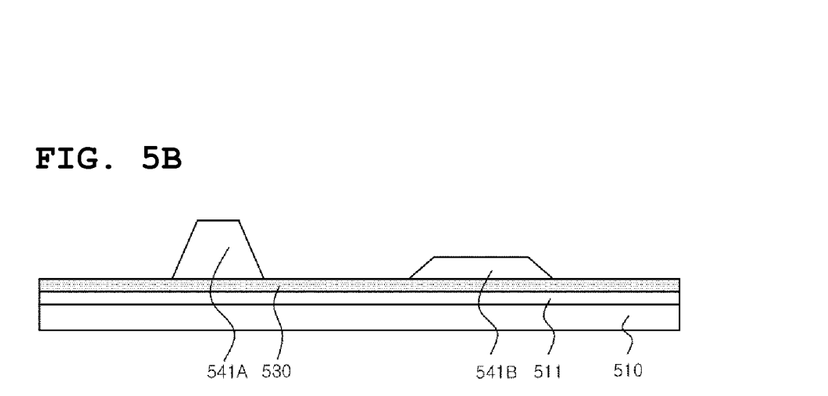

As can be seen from FIG. 5B, after the development process, a photoresist 541A in a region corresponding to the transmissive portion 503 remains, and a photoresist 541B in a region corresponding to the translucent portion 504 partially remains.

Figure 5C:
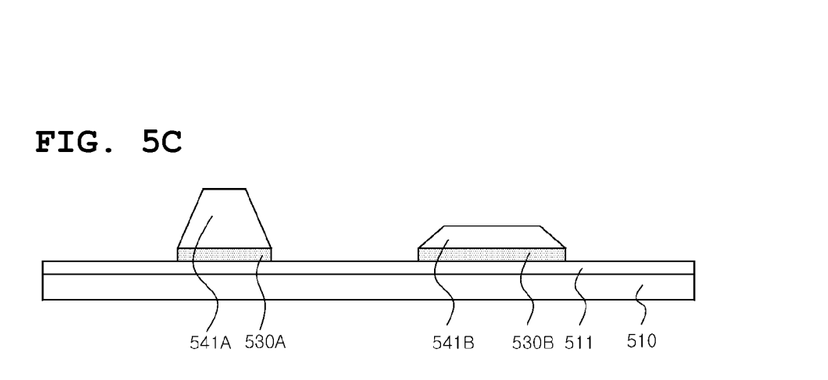

Referring to FIG. 5C, etching process is performed to remove the oxide semiconductor layer 530 where the photoresists 541A and 541B do not remain. After etching process, in the oxide semiconductor layer 530, the region corresponding to the transmissive portion 503 is referred to as the active layer 530A, and the region corresponding to the translucent portion 504 is referred to as the lower electrode portion 530B. The active layer 530A is spaced apart from the lower electrode portion 530B.

Figure 5D:
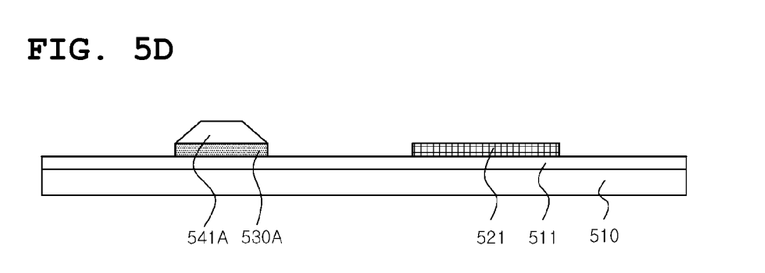

Subsequently, as shown in FIG. 5D, a part of the photoresist 541A on the active layer 530A and the photoresist 541B on the lower electrode portion 530B are removed by ashing process. After ashing process, the photoresist 541B is removed to expose the lower electrode portion 530B, and a part of photoresist 541A remains on the active layer 530A.

Then, the lower electrode portion 530B is conductivized to form a lower electrode 521 of a storage capacitor Cst S. Conductivizing process may include performing drying etching, hydrogen plasma treatment, helium plasma treatment and the like on the lower electrode portion 530B. The active layer 530A where the photoresist 541A remains is not conductivized. Subsequently, the photoresist 541A remaining on the active layer 530A is stripped.

The patterning process and the conductivizing process of the oxide semiconductor layer 530 illustrated in FIGS. 5A to 5D may be conducted by using various processes other than the process with the half-tone mask 501. For example, the oxide semiconductor layer 530 may be patterned or conductivized using two photo masks instead of the half-tone mask 501.

Figure 5E:
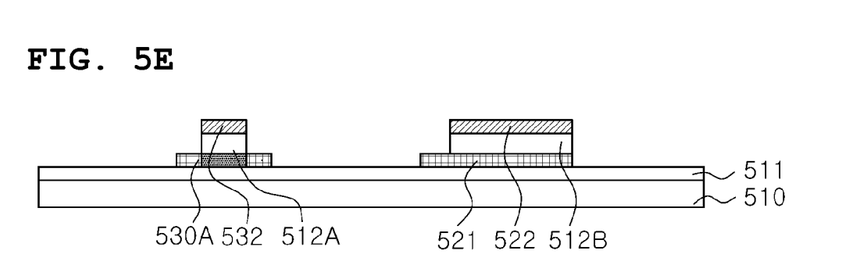

Then, referring to FIG. 5E, a gate insulation layer 512A is formed on the active layer 530A, and a first insulation layer 512B is formed on the lower electrode 521. The gate insulation layer 512A and the first insulation layer 512B may be formed of the same material. And the first insulation layer 512B may be formed simultaneously with the gate insulation layer 512A. Thus, the first insulation layer 512B and gate insulation layer 512 may be referred to as a base insulation layer.

A gate electrode 532 is formed on the gate insulation layer 512A, and an intermediate electrode 522 is formed on the first insulation layer 512B. In other words, the gate electrode 532 and the intermediate electrode 522 are formed on the base insulation layer. The gate electrode 532 may be formed of the same material as the intermediate electrode 522. For example, a first conductive layer is deposited on the base insulation layer, and then, the first conductive layer is patterned to form the gate electrode 532 and the intermediate electrode 522 spaced apart from the gate electrode 532. The gate electrode 532 overlaps with at least a part of the active layer 530A. The intermediate electrode 522 overlaps at least a part of the lower electrode 521.

In addition, exposed portions of the active layer 530A are conductivized (S500). The exposed portions of the active layer 530A mean the portions where the active layer 530A is not overlapped with the gate electrode 532 or the gate insulation layer 512A. Herein, conductivizing the exposed portions of the active layer 530A may be performed separately from conductivizing the lower electrode portion 530B for forming the above described lower electrode 521. However, the process for conductivizing the exposed portions of the active layer 530A and the process for conductivizing the lower electrode portion 530B may be performed simultaneously.

Figure 5F:
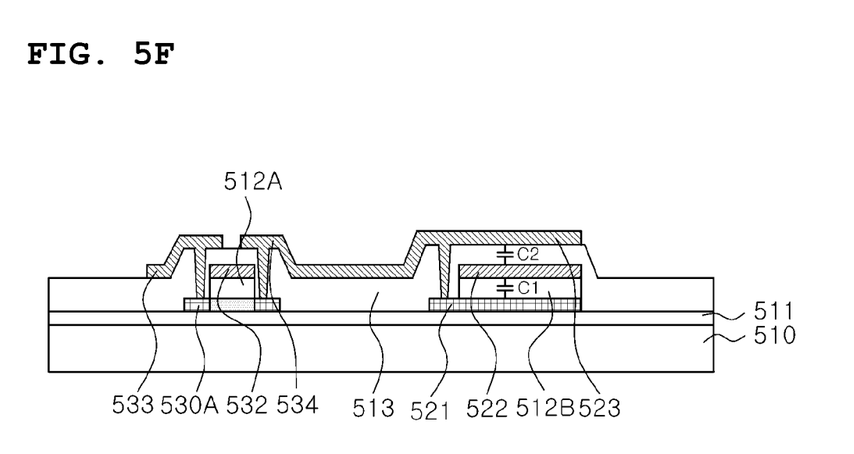

Then, referring to FIG. 5F, an additional insulation layer 513 is formed over the gate electrode 532 and the intermediate electrode 522. To be specific, an inter-insulation layer is formed on the gate electrode 532, and a second insulation layer is formed on the intermediate electrode 522. The second insulation layer may be formed simultaneously with inter-insulation layer. Thus, the inter-insulation layer and the second insulation layer may be referred to as the additional insulation layer 513.

A source electrode 533 and a drain electrode 534 are formed over the active layer 530A. Further, an upper electrode 523 is formed over the intermediate electrode 522 (S600). Also, the source electrode 533, the drain electrode 534 and the upper electrode 523 are formed on the additional insulation layer 513. The upper electrode 523 may be formed of the same material as the source electrode 533 and the drain electrode 534. For example, a second conductive layer is deposited on the additional insulation layer 513. And then, the second conductive layer is patterned to form the source and drain electrodes 533 and 534 and the upper electrode 523.

The source electrode 533 and the drain electrode 534 are electrically connected to the conductivized regions of the active layer 530A via contact holes in the additional insulation layer 513, respectively. The upper electrode 523 is connected to the lower electrode 521 via a contact hole in the additional insulation layer 513. Although the drain electrode 534 and the upper electrode 523 are illustrated as being electrically connected to each other in FIG. 5F, the upper electrode 523 may be connected to the source electrode 533 depending on the type of thin-film transistor.

The lower electrode 521, the intermediate electrode 522 and the first insulation layer 512B therebetween form a first capacitor C1, and the intermediate electrode 522, the upper electrode 523 and the additional insulation layer 513 therebetween form a second capacitor C2. In addition, the lower electrode 521 and the upper electrode 523 are connected to each other, and thus the first capacitor C1 and the second capacitor C2 operate in parallel.

In this specification, a substrate refers to a member that supports various elements formed thereon. The substrate may be comprised of an insulation material. For example, the substrate may be, but is not limited to, comprised of glass or plastic.

In this specification, an oxide semiconductor layer may include various oxides that can be made conductivized. For example, in addition to the above-mentioned indium-gallium-zinc-oxide (InGaZnO), the oxide semiconductor may include: quaternary metal oxide such as indium-tin-gallium-zinc-oxide (InSnGaZnO) based material; ternary metal oxide such as indium-tin-zinc-oxide (InSnZnO) based material, indium-aluminum-zinc-oxide (InAlZnO) based material, indium-hafnium-zinc-oxide (InHfZnO) based material, tin-gallium-zinc-oxide (SnGaZnO) based material, aluminum-gallium-zinc-oxide (AlGaZnO) based material, and tin-aluminum-zinc-oxide based (SnAlZnO) material; binary metal oxide such as indium-zinc-oxide (InZnO) based material, tin-zinc-oxide (SnZnO) based material, aluminum-zinc-oxide (AlZnO) based material, zinc-magnesium-oxide (ZnMgO) based material, tin-magnesium-oxide (SnMgO) based material, indium-magnesium-oxide (InMgO) based material, and indium-gallium-oxide (InGaO) based material; mono metal oxide such as indium-oxide (InO) based material, tin-oxide (SnO) material, and zinc-oxide (ZnO) based material. The composition ratios between the elements in the above materials of the oxide semiconductor are not particularly limited but may be variously determined.

In this specification, the conductive electrodes, i.e., the gate electrode, the source electrode, the drain electrode, the intermediate electrode, the upper electrode and the additional electrode may be comprised of, but are not limited to, molybdenum (Mo), aluminum (Al), chrome (Cr), gold (Au), titanium (Ti), nickel (Ni), neodymium (Nd) and copper (Cu) or an alloy thereof. In addition, the conductive electrodes, that is, the gate electrode, the source electrode, the drain electrode, the intermediate electrode, the upper electrode and the additional electrode may be multiple layers comprised of a material selected from a group consisting of molybdenum (Mo), aluminum (Al), chrome (Cr), gold (Au), titanium (Ti), nickel (Ni), neodymium (Nd) and copper (Cu) or an alloy thereof.

Hereinafter, various embodiments of the organic light-emitting display device according to the present invention will be described.

In some embodiments, the lower electrode, the first insulation layer and the intermediate electrode form a first capacitor, and the intermediate electrode, the second insulation layer and the upper electrode form a second capacitor, wherein the first capacitor and the second capacitor are connected to each other in parallel to form a storage capacitor.

In some embodiments, capacitance of the first capacitor is larger than capacitance of the second capacitor.

In some embodiments, the first insulation layer is thinner than the second insulation layer.

In some embodiments, the display device further comprises an additional electrode on the upper electrode, at least a part of the additional electrode overlapping the upper electrode.

In some embodiments, the additional electrode is connected to the intermediate electrode.

In some embodiments, the coplanar thin-film transistor further comprises a gate insulation layer between the active layer and the gate electrode, wherein the first insulation layer is thinner than the gate insulation layer.

In some embodiments, the coplanar thin-film transistor further comprises an inter-insulation layer between the gate electrode and the source electrode or the drain electrode, wherein the second insulation layer is thinner than the inter-insulation layer.

In some embodiments, the intermediate electrode is connected to the gate electrode of the coplanar TFT.

In some embodiments, the upper electrode is electrically connected to one of the source electrode or the drain electrode of the coplanar TFT.

In some embodiments, the display device further comprises an organic light-emitting element including an anode that is electrically connected to the source or drain electrode connected to the upper electrode.

In some embodiments, the display device further comprises an organic light-emitting element including an anode that is electrically connected to the source or drain electrode connected to the upper electrode, and a connection part interposed between the anode and one of the source electrode or drain electrode, the connection part being comprised of the same material as the additional electrode.

In some embodiments, the display device further comprises a plurality of sub-pixels including a light-emitting region and a light-transmissive region, respectively, wherein the storage capacitor is positioned in the light-emitting region.

In some embodiments, the storage capacitor in at least one of the plurality of sub-pixels has a size that is different from the size of the storage capacitor in another sub-pixel.

According to an exemplary embodiment of the present disclosure, there is provided a method of manufacturing a displace device. The method of manufacturing a displace device comprises forming an oxide semiconductor layer on a substrate, patterning the oxide semiconductor layer to form an active layer and a lower electrode portion spaced apart from the active layer, conductivizing the lower electrode portion to form a lower electrode, forming a base insulation layer on the active layer and the lower electrode, forming a gate electrode and an intermediate electrode on the base insulation layer, forming an additional insulation layer over the gate electrode and the intermediate electrode, the additional insulation layer having a contact hole, and forming a source electrode, a drain electrode and an upper electrode, wherein the upper electrode connected to the lower electrode via the contact hole in the additional insulation layer.

In some embodiments, the step of forming the gate electrode and the intermediate electrode comprises depositing a first conductive layer on the base insulation layer, and patterning the first conductive layer to form the gate electrode and the intermediate electrode spaced apart from the gate electrode.

In some embodiments, the step of forming the source electrode, the drain electrode and the upper electrode comprises depositing a second conductive layer on the additional insulation layer, and patterning the second conductive layer to form the source and drain electrodes and the upper electrode.

The present invention has been described in more detail with reference to the exemplary embodiments, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A display device, comprising:
   a coplanar thin-film transistor (TFT) on a TFT region of a substrate, the coplanar thin-film transistor comprising a gate electrode, an active layer including an oxide semiconductor, a source electrode and a drain electrode;
   a lower electrode on a storage capacitor region, the lower electrode comprised of a same material as the active layer on the substrate, wherein the oxide semiconductor of the lower electrode is conductivized, wherein the lower electrode is separate from the source electrode and the drain electrode and the lower electrode is electrically connected to the source electrode or the drain electrode;
   a first insulation layer on the lower electrode;
   an intermediate electrode comprised of a same material as the gate electrode, the intermediate electrode positioned on the first insulation layer and having at least a part overlapping with the lower electrode;
   a second insulation layer on the intermediate electrode;
   an upper electrode comprised of a same material as the source electrode or as the drain electrode, the upper electrode positioned on the second insulation layer and having at least a part overlapping with the intermediate electrode;
   an additional electrode on the upper electrode, at least a part of the additional electrode overlapping the upper electrode, wherein the additional electrode has a direct electrical connection to the intermediate electrode; and
   a connection part overlapping the source electrode or the drain electrode and having a direct electrical connection to the source electrode or the drain electrode, wherein the upper electrode is connected to the lower electrode, wherein the lower electrode, the intermediate electrode and the upper electrode are located on the storage capacitor region of the substrate, wherein the intermediate electrode and the gate electrode are on a same plane and wherein the upper electrode and the source electrode or the drain electrode are on a same plane.

2. The display device according to claim 1, wherein the lower electrode, the first insulation layer and the intermediate electrode form a first capacitor, and the intermediate electrode, the second insulation layer and the upper electrode form a second capacitor, wherein the first capacitor and the second capacitor are connected to each other in parallel to form a storage capacitor.

3. The display device according to claim 2, wherein capacitance of the first capacitor is larger than capacitance of the second capacitor.

4. The display device according to claim 3, wherein the first insulation layer is thinner than the second insulation layer.

5. The display device according to claim 1, wherein the coplanar thin-film transistor further comprises a gate insulation layer between the active layer and the gate electrode, wherein the first insulation layer is thinner than the gate insulation layer.

6. The display device according to claim 1, wherein the coplanar thin-film transistor further comprises an inter-insulation layer between the gate electrode and the source electrode or the drain electrode, wherein the second insulation layer is thinner than the inter-insulation layer.

7. The display device according to claim 1, wherein the intermediate electrode is connected to the gate electrode of the coplanar TFT.

8. The display device according to claim 1, wherein the upper electrode is electrically connected to one of the source electrode or the drain electrode of the coplanar TFT.

9. The display device according to claim 8, further comprising an organic light-emitting element including an anode that is electrically connected to the source or drain electrode connected to the upper electrode.

10. The display device according to claim 1, wherein the connection part interposed between an anode of an organic light-emitting element and one of the source electrode or the drain electrode, the connection part being comprised of a same material as the additional electrode.

11. The display device according to claim 2, further comprising a plurality of sub-pixels including a light-emitting region and a light-transmissive region, respectively, wherein the storage capacitor is positioned in the light-emitting region.

12. The device according to claim 2, wherein the storage capacitor in at least one of the plurality of sub-pixels has a size that is different from the size of the storage capacitor in another sub-pixel.

13. The display device according to claim 1, wherein the lower electrode has a resistivity of $10^3$ Ω/□ (ohm per square) or smaller.

14. An organic light emitting display device, comprising:
a coplanar thin-film transistor (TFT) on a substrate, the coplanar thin-film transistor comprising a gate electrode, an active layer including an oxide semiconductor, a source electrode and a drain electrode;
a storage capacitor including
a lower electrode comprised of conductivized oxide semiconductor, wherein the lower electrode is separate from the source electrode and the drain electrode and the lower electrode is electrically connected to the source electrode or the drain electrode,
a first insulation layer on the lower electrode,
an intermediate electrode on the first insulation layer at a same plane as that
of the gate electrode, and having at least a part overlapping with the lower electrode,
a second insulation layer on the intermediate electrode,
an upper electrode on the second insulation layer at a same plane as that of the source electrode or the drain electrode, and having at least a part overlapping with the intermediate electrode, and
an additional electrode on the upper electrode, at least a part of the additional electrode overlapping the upper electrode, wherein the additional electrode has a direct electrical connection to the intermediate electrode;
a connection part overlapping the source electrode or the drain electrode and having a direct electrical connection to the source electrode or the drain electrode; and
an organic light-emitting element including an anode that is electrically connected to the source or drain electrode of the coplanar TFT connected to the upper electrode of the storage capacitor.

15. The organic light emitting display device according to claim 14, wherein the substrate has a light-transmissive region and a light-emitting region, and wherein the coplanar TFT, the storage capacitor and the organic light-emitting element are positioned in the light-emitting region.

16. The organic light emitting display device according to claim 14, wherein the coplanar TFT and the storage capacitor are not positioned in the light-emitting region.

17. The organic light emitting display device according to claim 14, wherein the storage capacitor in at least one of a plurality of sub-pixels has a size that is different from the size of the storage capacitor in another sub-pixel.

18. A semiconductor device comprising:
a multi-layered capacitance structure, with alternating electrodes layers and insulating layers, having at least a first capacitor and a second capacitor connected in parallel to operate together as one capacitor,
the multi-layered capacitance structure configured to accommodate a maximum number of sub-pixels per unit area for a display panel while providing appropriate storage capacitance sufficient for applying relatively stable data voltage to a respective sub-pixel of the display panel, and
the multi-layered capacitance structure comprising,
an intermediate electrode at a same planar level as that of a gate electrode of a thin film
transistor (TFT) configured to drive the respective sub-pixel,
a lower electrode comprised of conductivized oxide semiconductor at a same planar level as that of an oxide semiconductor layer of the TFT but disconnected therefrom, wherein the lower electrode is separate from a source electrode and a drain electrode of the thin film transistor (TFT) and the lower electrode is electrically connected to the source electrode or the drain electrode,
an upper electrode disposed at a same plane as that of the source electrode or the drain electrode of the thin film transistor (TFT) and having at least a part overlapping with the intermediate electrode, and
an additional electrode on the upper electrode, at least a part of the additional electrode overlapping the upper electrode, wherein the additional electrode has a direct electrical connection to the intermediate electrode.

19. The semiconductor device of claim 18, wherein the multi-layered capacitance structure further comprises:
a first insulator layer on the lower electrode;
a second insulator layer on the intermediate electrode; and
the upper electrode on the second insulator layer,
the first capacitor consisting of the lower electrode, the first insulator layer and the intermediate electrode, and
the second capacitor consisting of the intermediate electrode, the second insulator layer and the upper electrode.

20. The semiconductor device of claim 19, further comprising an organic light-emitting element including an anode that is electrically connected to a source or drain electrode of the thin film transistor connected to the upper electrode.

21. The semiconductor device of claim 20, further comprising a connection part interposed between the anode and one of the source electrode or drain electrode, the connection part being comprised of a same material as the additional electrode.

22. The semiconductor device of claim 20, wherein the respective sub-pixel of the display panel has a light-transmissive region and a light-emitting region, and wherein the thin film transistor, the multi-layered capacitance structure and the organic light-emitting element are only positioned in the light-emitting region.

23. The semiconductor device of claim 18, wherein the lower electrode is conductivized as a result of a hydrogen plasma treatment process or a helium plasma treatment process.

24. A display device comprising:
a substrate having an array of pixels;
each pixel having a pixel circuit that includes a thin-film transistor (TFT) and a capacitor electrically connected to the TFT;
the TFT having an active layer that corresponds to a lower electrode of the capacitor;
the TFT having a gate layer that corresponds to an intermediate electrode of the capacitor;
the TFT having a source electrode or a drain electrode that corresponds to an upper electrode of the capacitor; and
the TFT having a connection part that corresponds to an additional electrode of the capacitor wherein the source electrode or the drain electrode of the TFT and the upper electrode of the capacitor are electrically connected; wherein a first capacitance is formed between the lower electrode of the capacitor and the intermediate electrode of the capacitor, a second capacitance is formed between the intermediate electrode of the capacitor and the upper electrode of the capacitor, a third capacitance is formed between the upper electrode of the capacitor and the additional electrode of the capacitor.

25. The display device of claim 24, wherein at least one among the active layer of the TFT and the lower electrode of the capacitor, the gate layer of the TFT and the intermediate electrode of the capacitor, the source electrode or the drain electrode of the TFT and the upper electrode of the capacitor, and the connection part of the TFT and the additional electrode of the capacitor are made of a same material during a same manufacturing process using a halftone mask.

* * * * *